(12) United States Patent
Liu

(10) Patent No.: US 12,136,543 B2
(45) Date of Patent: Nov. 5, 2024

(54) DEVICE FOR REDUCING MISALIGNMENT BETWEEN SPUTTERING TARGET AND SHIELD

(71) Applicant: Honeywell International Inc., Charlotte, NC (US)

(72) Inventor: Bo Liu, Spokane Valley, WA (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 18/195,985

(22) Filed: May 11, 2023

(65) Prior Publication Data

US 2024/0021422 A1 Jan. 18, 2024

Related U.S. Application Data

(60) Provisional application No. 63/390,052, filed on Jul. 18, 2022.

(51) Int. Cl.
*H01J 37/34* (2006.01)
*C23C 14/34* (2006.01)

(52) U.S. Cl.
CPC ...... *H01J 37/3435* (2013.01); *C23C 14/3407* (2013.01); *H01J 37/3441* (2013.01)

(58) Field of Classification Search
CPC ............... H01J 37/3447; H01J 37/3441; H01J 37/32651; C23C 14/3407
USPC .................................................. 204/298.11
See application file for complete search history.

(56) References Cited

U.S. PATENT DOCUMENTS

| | | | |
|---|---|---|---|
| 4,708,183 A | * | 11/1987 | Figueroa .................. F16B 2/12 248/231.71 |
| 5,334,298 A | | 8/1994 | Gegenwart |
| 5,538,603 A | | 7/1996 | Guo |
| 6,689,254 B1 | | 2/2004 | Hurwitt |
| 6,998,033 B2 | | 2/2006 | Lawson et al. |
| 9,534,286 B2 | | 1/2017 | Yoshidome et al. |
| 2014/0261175 A1 | | 9/2014 | Hanson et al. |

(Continued)

FOREIGN PATENT DOCUMENTS

| | | |
|---|---|---|
| EP | 0853331 A2 | 2/2003 |
| JP | 01-286271 A | 11/1989 |
| JP | 2006-037120 A | 2/2006 |

(Continued)

OTHER PUBLICATIONS

International Search Report and Written Opinion received for PCT Patent Application No. PCT/US2023/027618, mailed on Oct. 27, 2023, 8 pages.

(Continued)

*Primary Examiner* — Rodney G McDonald
(74) *Attorney, Agent, or Firm* — Faegre Drinker Biddle & Reath LLP

(57) ABSTRACT

A spacing guide for use on a dark space shield of a sputtering chamber includes a horizontal body having a first end, a second end opposite the first end and a thickness, the horizontal body configured to rest on an end of the dark space shield; a first leg extending laterally from the first end of the horizontal body and configured to rest against an outer surface of the dark space shield; and a second leg extending laterally from the second end of the horizontal body and configured to rest against the inner surface of the shield.

19 Claims, 5 Drawing Sheets

(56) References Cited

U.S. PATENT DOCUMENTS

2014/0284210 A1 9/2014 Ishihara
2021/0292888 A1 9/2021 Lavitsky et al.

FOREIGN PATENT DOCUMENTS

KR 10-2253563 B1 5/2021
WO 2019/091561 A1 5/2019

OTHER PUBLICATIONS

Rastogi et al., "Simple planar magnetron sputtering source", Review of Scientific Instrument, vol. 58, Issue 8, Aug. 1, 1987, pp. 1505-1506.

* cited by examiner

DEVICE FOR REDUCING MISALIGNMENT BETWEEN SPUTTERING TARGET AND SHIELD

CROSS-REFERENCE TO RELATED APPLICATION

This application claims priority to U.S. Provisional Application No. 63/390,052, filed Jul. 18, 2022, which is herein incorporated by reference in its entirety.

TECHNICAL FIELD

The instant disclosure relates to a device for reducing misalignment between a sputtering target and a shield and methods of using.

BACKGROUND

Physical vapor deposition ("PVD") methodologies are used to form a thin film or layer of material over a variety of substrates. PVD methods can be used in, for example, semiconductor fabrication processes to form metallized layers in the fabrication of integrated circuitry structures and devices. In one PVD process, known as sputtering, atoms are ejected from the surface of a sputtering target by bombardment with gas ions such as argon. Thus, the sputtering target is the source of material which is deposited onto a substrate.

In some current PVD chambers, a process kit or dark space shield is mounted to the main body of the PVD chamber. The sputtering target is mounted separate from the shield on a removable lid of the PVD chamber. In use, the sputtering target is lowered into the chamber body when the lid is closed.

It has been discovered that misalignment between the dark space shield and the sputtering target can produce a variety of performance issues such as arcing, particle formation and film non-uniformity. A device and method for improved alignment of the dark space shield and sputtering target are needed.

SUMMARY

These and other needs are addressed by the various aspects and configurations of the present disclosure.

In Example 1, a spacing guide for use on a dark space shield of a sputtering chamber, in which the spacing guide includes a horizontal body having a first end, a second end opposite the first end and a thickness, the horizontal body configured to rest on an end of the dark space shield; a first leg extending laterally from the first end of the horizontal body and configured to rest against an outer surface of the dark space shield; and a second leg extending laterally from the second end of the horizontal body and configured to rest against the inner surface of the shield. The horizontal body, the first leg and the second leg are formed from an insulating material.

In Example 2, the spacing guide of Example 1, wherein the horizontal body is about 1 millimeter to about 30 millimeters thick.

In Example 3, the spacing guide of Example 1 wherein the second leg has a thickness of not more than about 30 millimeters.

In Example 4, the spacing guide of Example 1 wherein the first leg and the second leg have a different width, length, and thickness.

In Example 5, the spacing guide of Example 1 wherein the horizontal body, the first leg and the second leg are integrally formed.

In Example 6, a dark space shield assembly for use in a sputtering chamber, in which the dark space shield assembly includes an annular dark space shield having a first end configured to be proximate a substrate support pedestal and a second end configured to be proximate a sputtering target; and a plurality of spacing guides positioned on the second end of the annular dark space shield. Each spacing guide includes a horizontal body having a first end, a second end opposite the first end and a thickness, the horizontal body configured to rest on the second end of the annular dark space shield; a first leg extending laterally from the first end of the horizontal body and configured to rest against an outer surface of the annular dark space shield; and a second leg extending laterally from the second end of the horizontal body and configured to rest against the inner surface of the shield, wherein the horizontal body, the first leg and the second leg are formed from an insulating material.

In Example 7, the dark space shield assembly of Example 6 wherein the plurality of spacing guides are attached to the annular dark space shield only by friction forces.

In Example 8, the dark space shield assembly of Example 6 wherein the plurality of spacing guides are attached to the annular dark space shield by fasteners.

In Example 9, the dark space shield assembly of Example 6 wherein the spacing guides maintain the misalignment of the sputtering target and the annular dark space shield within about 5 millimeters along a horizontal axis.

In Example 10, the dark space shield assembly of Example 9 wherein the spacing guides maintain the misalignment of the sputtering target and the annular dark space shield within about 1 millimeter along horizontal axis.

In Example 11, the dark space shield assembly of Example 9, wherein the horizontal body is not more than about 30 millimeters thick.

In Example 12, the dark space shield assembly of Example 9 wherein the second leg has a thickness of not more than about 30 millimeters.

In Example 13, a sputtering chamber assembly includes a sputtering target; an annular dark space shield having a first end configured to be proximate a substrate support pedestal and a second end configured to be proximate the sputtering target; and a plurality of spacing guides positioned on the second end of the annular dark space shield. Each spacing guide includes a horizontal body having a first end, a second end opposite the first end and a thickness, the horizontal body configured to rest on the second end of the annular dark space shield; a first leg extending laterally from the first end of the horizontal body and configured to rest against an outer surface of the annular dark space shield; and a second leg extending laterally from the second end of the horizontal body and configured to rest against the inner surface of the shield, wherein the horizontal body, the first leg and the second leg are formed from an insulating material.

In Example 14, the sputtering chamber assembly of Example 13 wherein the plurality of spacing guides are attached to the annular dark space shield only by friction forces.

In Example 15, the sputtering chamber assembly of Example 13 wherein the plurality of spacing guides are attached to the annular dark space shield by fasteners.

In Example 16, the sputtering chamber assembly of Example 13 wherein the spacing guides maintain a misalignment of the sputtering target and the annular dark space shield within about 1 millimeter along a horizontal axis.

In Example 17, the sputtering chamber assembly of Example 16 wherein the spacing guides maintain the misalignment of the sputtering target and the annular dark space shield within 1 millimeter along a vertical axis.

In Example 18, the sputtering chamber assembly of Example 13 wherein the horizontal body is about 1 millimeter to about 30 millimeters thick.

In Example 19, the sputtering chamber assembly of Example 13 wherein the second leg has a thickness of not more than about 30 millimeters.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Various modifications and additions can be made to the exemplary embodiments discussed without departing from the scope of the present invention. For example, while the embodiments described above refer to particular features, the scope of these invention also includes embodiments having different combinations of features and embodiments that do not include all of the above-described features.

DETAILED DESCRIPTION

Disclosed herein are sputtering chamber components for use within a sputtering chamber to improve alignment of a sputtering target and dark space shield and methods of using the same. Embodiments of the invention may reduce or prevent arcing between the sputtering target and the shield by providing improved alignment between the sputtering target and the shield. As used herein, align or alignment refers to the concentric placement of the sputtering target and the dark space shield such that a gap of a first distance between the outer edge of the sputtering target and the inner surface of the dark space shield is consistent or substantially consistent along the perimeter of the sputtering target. During the sputtering process, a film is deposited on the flange of the sputtering target. Alignment between the sputtering target and the dark space shield is measured by removing the sputtering target from the sputtering chamber and determining the distance from the radially outer edge of the deposited film to the target sidewall at several locations about the parameter of the sputtering target. In one embodiment, this distance is determined by measuring the distance from the O-ring groove in the flange to the sputtering target sidewall with a caliper, measuring the distance from the O-ring groove in the flange to the radially outer edge of the deposited film with a caliper, and calculating the difference between these two values. The largest distance determined is the misalignment.

Embodiments of the invention may additionally or alternatively reduce particle formation by reducing arcing events. Arcing events generate particles. Deposition of particles is not desirable because deposition of particles on the substrate may damage the small feature sized devices being made on the substrate. Thus, it is desirable to avoid the formation of particles in the chamber. Embodiments of the invention may further or additionally improve uniformity of the deposited film. Large misalignment between the sputtering target and the dark space shield can lead to a non-uniform gap, which creates a non-uniform electrical field between dark space shield and sputter target. The non-uniform electrical field can lead to non-uniform plasma distribution, and thus to non-uniform film deposition on the substrate.

Figure 1:
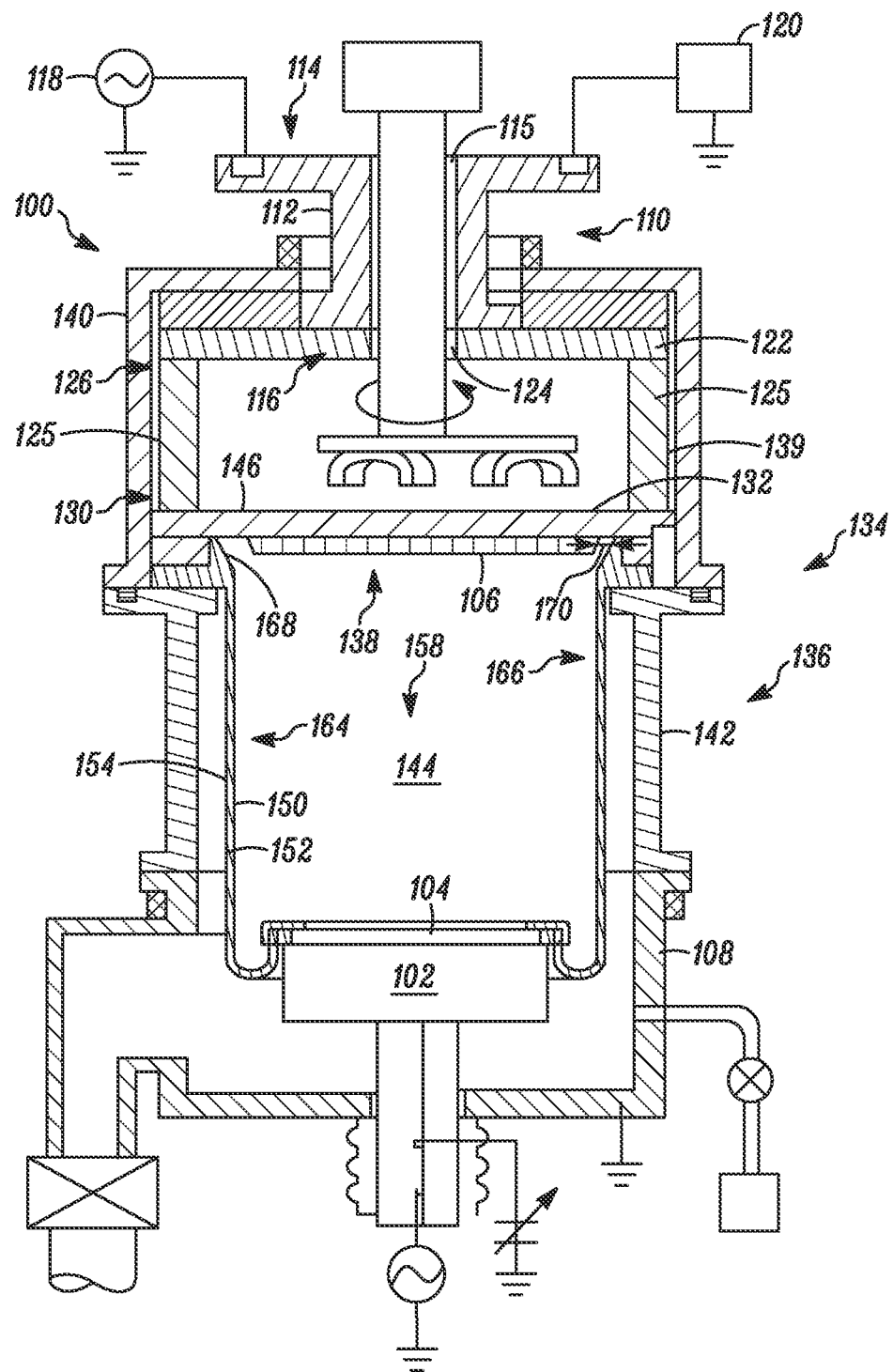
FIG. 1 is a simplified cross-sectional view of a physical vapor deposition chamber 100.

FIG. 1 is a cross-sectional view of a physical vapor deposition chamber 100 which includes chamber lid 134 and chamber body 136. Chamber lid 134 is removable from chamber body 136 and is shown in the closed position in FIG. 1.

Sputtering target assembly 138, which comprises backing plate 146 and sputtering target 106, can be mounted or removable attached to chamber lid 134, for example by pins or screws (not shown). When chamber lid 134 is closed, a sputtering surface of sputtering target 106 faces substrate support pedestal 102. Sputtering target assembly 138 can only comprise of a single piece.

Feed structure 110 and source distribution plate 122 may be used to distribute power to sputtering target 106. Feed structure 110 couples RF and, optionally, DC energy to sputtering target 106. Feed structure 110 includes body 112 having first end 114, second end 116 and central opening 115. First end 114 is coupled to RF power source 118, and optionally to DC power source 120, which can be used to supply RF power and DC power to sputtering target 106. Second end 116 is coupled to chamber lid 134. Central opening 115 extends through body 112 from first end 114 to second end 116. Feed structure 110 may be fabricated from suitable conductive materials to conduct RF and DC energy from RF power source 118 and DC power source 120. One skilled in the art will recognize that feed structures having other configurations may be used.

Source distribution plate 122 can be coupled to second end 116 of body 112 and may be used to distribute energy applied via feed structure 110 to the peripheral edge of sputtering target 106 by conductive member 125. Source distribution plate 122 can include hole 124 which aligns with central opening 115 of body 112. Source distribution plate 122 may be fabricated from suitable conductive materials to conduct RF and DC energy from feed structure 110.

Conductive member 125 can be a tubular member having first end 126 coupled to the source distribution plate 122 and second end 130 coupled to backing plate 146 of sputtering target assembly. Ground shield 140 may cover the outside surfaces of chamber lid 134. Ground shield 140 may be fabricated from suitable conductive materials.

Insulative gap 139 is provided between ground shield 140 and the outer surfaces of source distribution plate 122, conductive member 125, and sputtering target 106 (and/or backing plate 146). Insulative gap prevents the RF and DC current from being routed directly to ground. Insulative gap 139 may be filed with air or a suitable dielectric material, such as a ceramic.

Chamber lid 134 can be rotatably opened from atop chamber body 136. In some cases, chamber lid 134 may be opened to install or replace a sputtering target or for performing maintenance on the physical vapor deposition chamber 100. In some embodiments, chamber lid 134 may be movable about a horizontal axis of rotation from a closed position to an open position. For example, chamber lid 134 may move in an arc about the axis of rotation between a closed position and an open position.

Chamber body 136 may be formed from grounded enclosure wall 108 and upper chamber wall 142, and may contain substrate support pedestal 102, inner volume 144, and dark space shield or process shield 150. Substrate support pedestal 102 receives substrate 104.

Dark space shield 150 comprises an annular body having an inner surface 152 and an outer surface 154 defining a central opening 158. Dark space shield 150 extends along the walls of upper chamber wall 142 and grounded enclosure wall 108 downwardly to below a top surface of substrate support pedestal 102 and returns upwardly until reaching a top surface of substrate support pedestal 102. The opposite end of dark space shield 150 is proximate sputtering target 106. Dark space shield 150 is spaced from sputtering target 106 by radial gap 170.

In use, electrons are emitted from a negatively charged sputtering target 106. These electrons collide with argon atoms to form ionized atoms or plasma, which in turn accelerate towards the negatively charged sputtering target 106. The argon atoms strike sputtering target 106, resulting in a chain reaction of many collisions and displace atoms from sputtering target 106 which form a thin film on substrate 104. In some embodiments, suitable substrates 104 include wafers used in semiconductor fabrication. For example, sputtering target 106 is bombarded with energy until atoms from the surface are released into the surrounding atmosphere and subsequently deposited on substrate 104. In some embodiments, plasma sputtering is used to deposit a thin metal film onto wafers for use in electronics.

Figure 2:
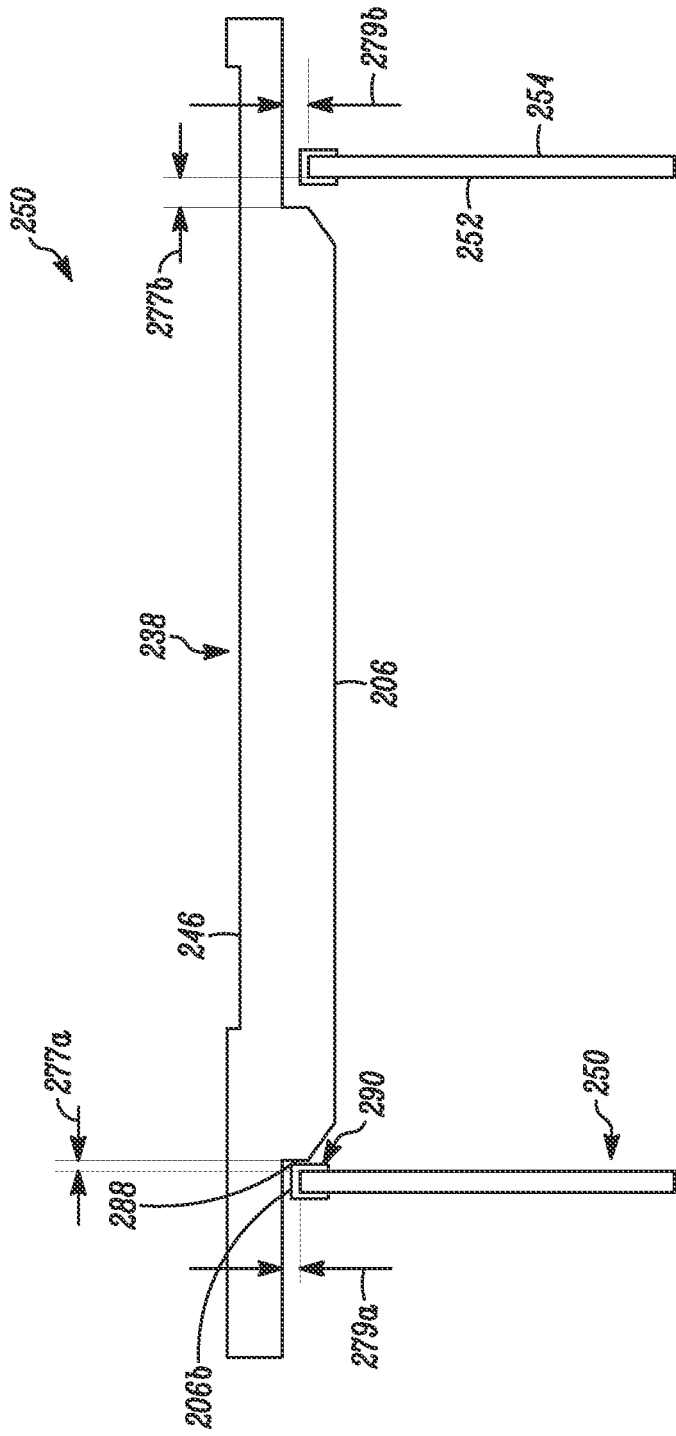
FIG. 2 is a schematic cross-sectional view of a portion of a sputtering chamber.

FIG. 2 is a schematic cross-sectional view of a portion of sputtering chamber 200. In sputtering chamber 200, dark space shield 250 radially surrounds sputtering target 206 of sputtering target assembly 238. In the radial direction (or along a horizontal axis in FIG. 2), the inner surface 252 of dark space shield 250 is spaced apart from the outer or radial surface 288 of sputtering target 206 by a distance 277a and 277b (referred to generally as distance 277). In some embodiments, the distance 277 can be between about 3 millimeters (mm) and about 6 mm, or between about 2 mm and about 4 mm. Misalignment between sputtering target 106 and dark space shield 250 results in distance 277 not being equal around the parameter of sputtering target 206. For example, it can result in 277a and 277b not being equal. For example, as shown in FIG. 2, dark space shield 250 is closer to sputtering target 206 on the left side resulting in distance 277b being larger than distance 277a. In some embodiments, the radial gap 277 does not vary by more than about 5 mm or about 2 mm or about 1 mm around the perimeter of sputtering target 206. That is, for example, distance 277a and 277b do not vary by more than about 1 mm from each other. As discussed herein, misalignment of sputtering target 206 and dark space shield 250 can create performance issues. It has been found that sputtering target performance is typically more acceptable or improves when distance 277 varies about 1 mm or less around the perimeter of sputtering target 206, or the misalignment between sputtering target 206 and dark space shield 250 in the radial direction is about 1 mm or less.

In the vertical direction, the end of dark space shield 250 is also spaced apart from sputtering target assembly 238, and as shown in FIG. 2, from backing plate 146 by distance 279 and 279b (referred to generally as distance 279). Misalignment of dark space shield 250 and sputtering target 206 can result in 279a and 279b not being equal. In some embodiments, the distance 279 does not vary by more than about 1 mm around the perimeter of sputtering target 206. That is, for example, distance 279a and 279b do not vary by more than about 1 mm from each other. As discussed herein, misalignment of sputtering target 206 and dark space shield 250 can create performance issues. It has been found that sputtering target performance is acceptable or improves when distance 279 varies about 1 mm or less around the perimeter of sputtering target 206, or said another way, the misalignment of sputtering target 206 and dark space shield 250 in the vertical direction is about 1 mm or less.

Spacing guide 290 fits or is positioned on the end of dark space shield 250. A portion of spacing guide 290 is positioned between the end of dark space shield 250 and backing plate 246. Another portion of spacing guide 290 is positioned between radial surface 288 of sputtering target 206 and dark space shield 250. Spacing guide 290 maintains minimum spacing between sputtering target assembly 238 and dark space shield 250. In the radial direction (or along a horizontal axis in FIG. 2), the inner surface of dark space shield 250 is spaced apart from the outer or radial surface 288 of sputtering target 206 by a distance 277. In the vertical direction, the end of shield 250 is spaced apart from sputtering target assembly 238, and as shown in FIG. 2, from backing plate 146 by distance 279. In FIG. 2, spacing guide 290 maintains this minimum spacing in the horizontal axis and vertical axis. However, spacing guide 290 may be designed to maintain a minimum along only one of the horizontal axis and vertical axis. In some embodiments, spacing guide 290 is designed so that misalignment of sputtering target 206 and shield 250 cannot be greater than about 1 mm.

A suitable number of spacing guides 290 may be used to space, align or distance dark space shield 250 and sputtering target 206. In some embodiments, three spacing guides 290 are positioned, such as equally spaced, on the end of and around the circumference of dark space shield 250. In some embodiments, more than three spacing guides 290 may be used on dark space shield 250.

Figure 3:
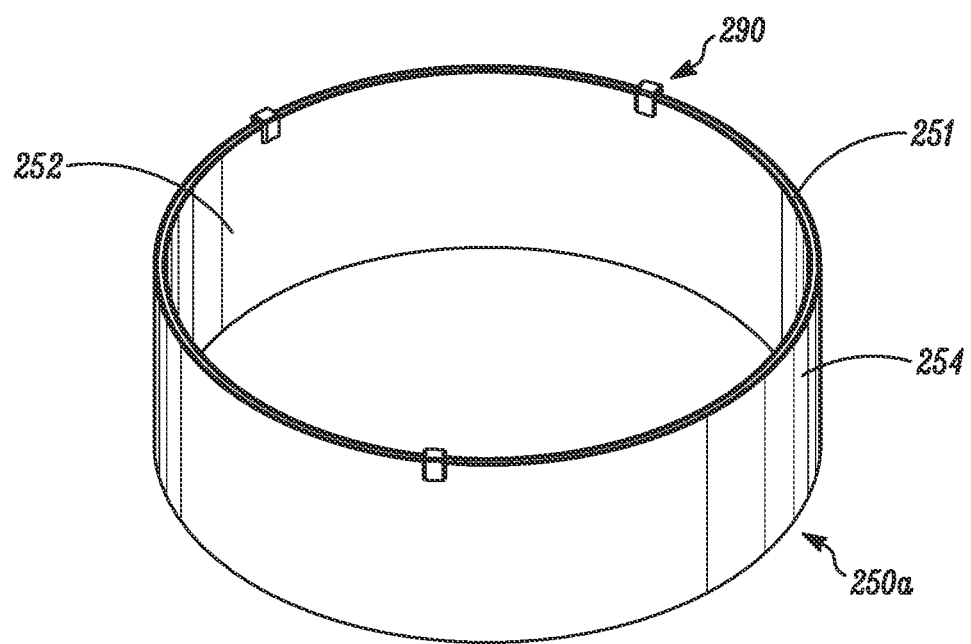
FIG. 3 is a perspective view of an embodiment.

FIG. 3 is a perspective view of one embodiment in which spacing guides 290 (three shown in FIG. 3) sit or rest on the end 251 of dark space shield 250a. As shown, spacing guide 290 extends from the end 251 of dark space shield 250a. In this way, spacing guide 290 can create a minimum distance between dark space shield 250a and sputtering target 206 along the vertical axis. In some embodiments, spacing guides 290 are equally spaced around dark space shield 250a. In other embodiments, spacing guides 290 are not equally spaced apart.

Figure 4A:
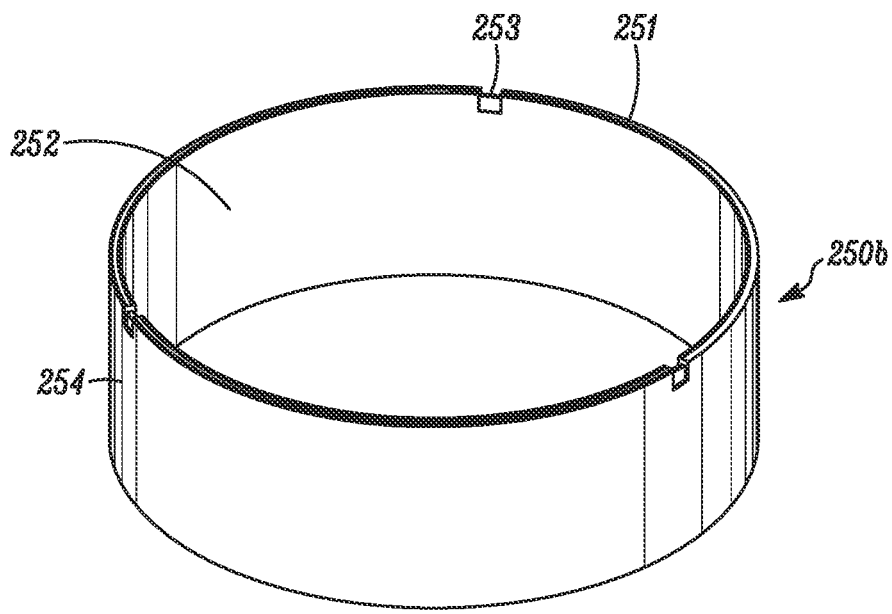
FIGS. 4A and 4B are perspective views of an alternative embodiment.
Figure 4B:
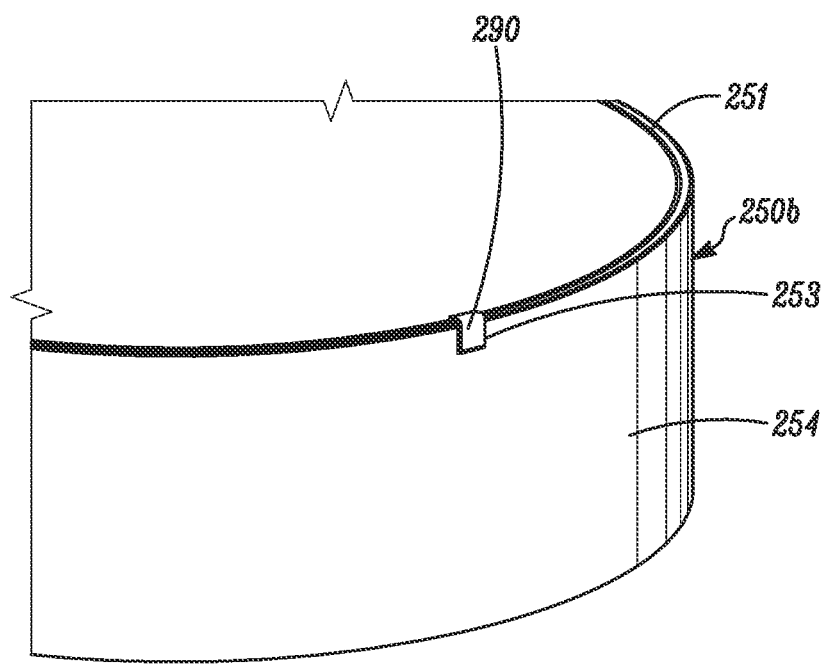

FIGS. 4A and 4B are perspective views of another embodiment in which portions along end 251 of dark space shield 250b are removed at notches 253 to accommodate spacing guides 290 (shown in enlarged view of FIG. 4B.) FIG. 4B is an enlarged view of dark space shield 250b in which spacing guide 290 is positioned in notch 253. As shown in FIG. 4B, in some embodiments, the top of spacing guide 290 projects or extends from the end of dark space shield 250b. In other embodiments, the top of spacing guide 290 aligns or substantially aligns with the end of dark space shield 250b. In some embodiments, spacing guide 290 projects radially from the inner surface of dark space shield 250B. In some embodiments, spacing guides 290 are equally spaced around dark space shield 250b. In other embodiments, spacing guides 290 are not equally spaced apart.

Figure 5:
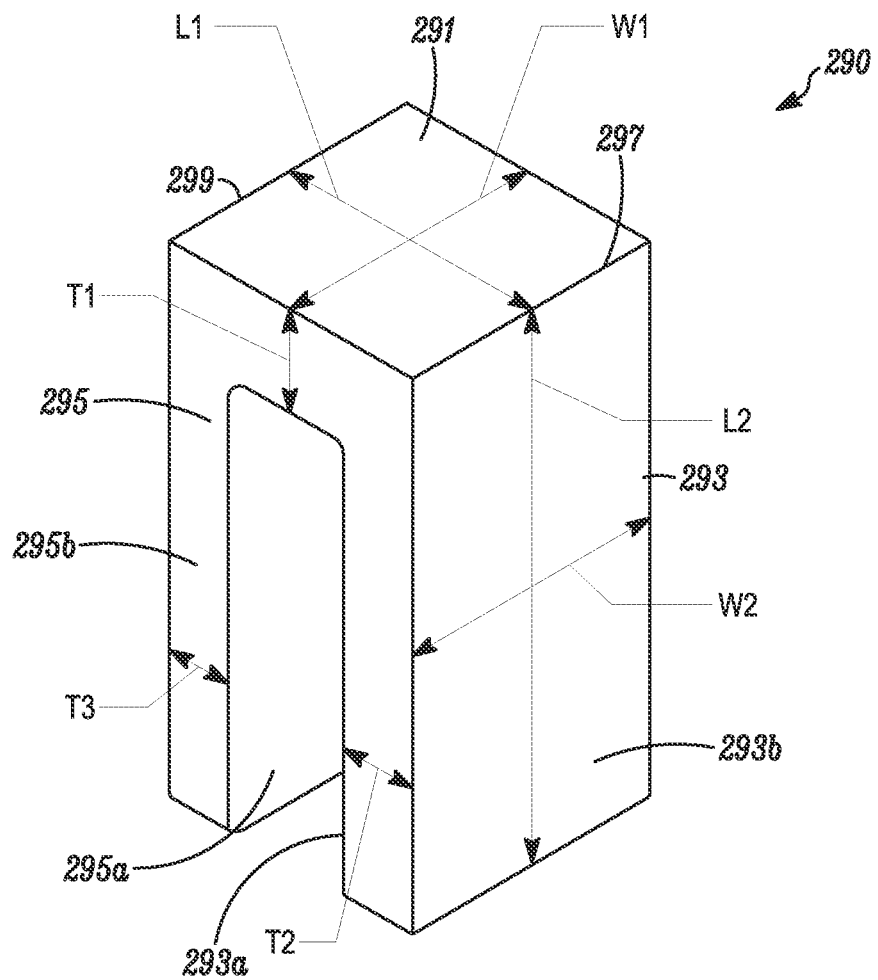
FIG. 5 is a perspective view of a spacing guide.

FIG. 5 is a perspective view of a spacing guide 290 according to one embodiment. Spacing guide 290 includes horizontal body 291, a first leg 293, and a second leg 295. First leg 293 extends perpendicularly or laterally from a first end 297 of horizontal body 291. Second leg 295 extends perpendicularly or laterally from a second end 299 of horizontal body 291. Horizontal body 291, first leg 293 and second leg 295 can be separate, individual pieces that are connected to form spacing guide 290. Alternatively, horizontal body 291, first leg 293 and second leg 295 may be formed as a single, integral piece. Spacing guide 290 may be formed from any suitable insulative material, such as Teflon or a ceramic.

Horizontal body 291 has a width W1, a length L1 and a thickness T1. Length L1 is selected so that first leg 293 and second leg 295 sit against the inner surface 252 and outer surface 254 of dark space shield 250, respectively, when spacing guide 290 is positioned on shield 250. In some embodiments, length L1 is selected such that spacing guide 290 is held on dark space shield 250 by gravity and/or friction forces and no other connectors or fasteners, such as screws or pins, are necessary. In some embodiments, spacing guide 290 may be connected to dark space shield 250 by a fastener. For example, a fastener, such as a screw or pin, may be positioned through the horizontal body 291 and the end of dark space shield 250. Length L1 is selected so that spacing guide 290 is able to sit on dark space shield 250. If length L1 is too short, spacing guide 290 will not remain on dark space shield 250. Additionally, length L1 is selected to be accommodated within the space defined by dark space shield 250 shield and target sidewall. If length L1 is too long, spacing guide 290 will not fit into the space between dark space shield 250 and sputtering target 206. In some embodiments, length L1 is about 10 mm to about 100 mm, such as about 15 mm to about 30 mm. After installing spacing guides 290, the space defined by dark space shield 250 and the sidewall of sputtering target 206 is partially taken by spacing guides 290 and the rest space is still left empty.

Width W1 is selected such that horizontal body 291 is suitably stable and has desired handleability. If width W1 is too small, spacing guide 290 may be insubstantial, unstable, or fragile. If width W1 is too large, spacing guide 290 may not conform to the curvature of dark space shield 250 and may be hard to install. In some embodiments, width W1 can be about 1 mm to about 100 mm, such as about 5 mm to about 50 mm or about 10 mm to about 30 mm.

Thickness T1 is selected to create a stable horizontal body 291. If thickness T1 is too small, horizontal body 291 may tear or break easily. If thickness T1 is too large, horizontal body 291 may be too stiff and may be difficult to conform to shape of dark space shield 250. Additionally, if thickness T1 is too large, spacing guide 290 may be difficult to be accommodated into the tight space between dark space shield 250 and sputtering target 206. In some embodiments, thickness T1 can be selected to provide a minimum distance between dark space shield 250 and radial surface 288 of sputtering target 206. In some embodiments, thickness T1 may be at least about 2 mm. This can help to reduce or eliminate the arcing due to the misalignment between dark space shield 250 and surface 206b of sputtering target assembly 238 in the vertical direction, as the spacing guide thickness T1 can prevent the direct touch between the dark space shield and the sputtering target assembly surface 206b. In some embodiments, thickness T1 may be about 1 mm to about 30 mm, or from about 2 mm to about 20 mm, or from about 3 mm to about 10 mm. In embodiments in which spacing guide 290 fits within notch 253 of dark space shield 250, thickness T1 may be greater than about 30 mm.

First leg 293 and second leg 295 extend laterally from and are perpendicular to horizontal body 291. First leg 293 has an inner surface 293a and an outer surface 293b. Inner surface 293a is configured to be adjacent to or to rest against outer surface 254 of dark space shield 250. Second leg 295 has inner surface 295a and outer surface 295b. Inner surface 295a is configured to be adjacent to or to rest against inner surface 252 of dark space shield 250.

First leg 293 has width W2, length L2 and thickness T2. Thickness T2 is selected so that first leg 293 is thick enough to keep this leg strong and thin enough to be installed within the tight space between dark space shield 150 and upper chamber wall 142.

Second leg 295 has a thickness T3. In some embodiments, thickness T3 is selected to maintain a minimum gap between inner surface 252 of dark space shield 250 and sputtering target assembly 238. In some embodiments, thickness T3 may be at least 1 mm. This limits the misalignment between dark space shield 250 and radial surface 288 of sputtering target 206 in the radial direction. In some embodiments, thickness T3 may be from about 1 mm to about 20 mm, or from about 2 mm to about 15 mm, or from about 3 mm to about 10 mm.

One skilled in the art will recognize that second leg 295 also has a width and length. In some embodiments, first leg 293 and second leg 295 are identical in shape. In other embodiments, first leg 293 and second leg 295 may have different shapes. For example, first leg 293 and second leg 295 may have different thicknesses.

Misalignment between dark space shield and target assembly may account for 50% or more of all sputtering target related performance issues in sputtering chambers. Data suggests that a small amount of misalignment, such as less than about 1 mm, may improve or at least not have detrimental effects on the performance of the sputtering target. However, misalignment of more than about 1 mm may negatively impact performance of the sputtering target. For example, misalignment between the sputtering target and dark space shield can lead to chip-outs along the outer radial perimeter of the sputtering target. Besides, misalignment can also result in arcing, particle issues and/or film uniformity issues.

Spacing guide 290 separates sputtering target 206 and dark space shield 250 physically and electrically. Spacing guide 290 can space sputtering target 206 from dark space shield 250 by a distance greater than about 3 mm and less than or equal to about 10 mm about the perimeter or circumference of sputtering target 206 as measured in the radial or horizontal direction. Similarly, spacing guide 290 may space sputtering target from dark space shield 250 in the vertical direction by the distance greater than about 3 mm and less than or equal to about 10 mm about the perimeter or circumference of sputtering target 206. It is important to keep the spacing within this range due to the fact that irregular target surface or accumulated flakes may leads to electrical shortage and arcing if the spacing is too small, or plasma leakage may happen between the dark space shield and sputtering target assembly surface 206b or 288 which also leads to electrical shortage if the spacing is too big. Maintaining a spacing in the radial and/or vertical direction(s) improve alignment of sputtering target 206 and dark space shield 250. In some embodiments, spacing guide 290 reduces arcing events during the sputtering process.

Methods of use of spacing guides 290 are also provided. In some embodiments, spacing guides 290 are placed onto a commercially available dark space shield 250 such that one leg 295 of the spacing guide 290 rests along the inner surface 252 of dark space shield 250 and the other leg 293 of the spacing guide 290 rests along the outer surface 254 of the dark space shield. The inner surface of the horizontal body of the spacing guide 290 rests on or is immediately adjacent to the end of dark space shield 250. In some embodiments, three spacing guides 290 are equally spaced around the perimeter of dark space shield 250. In other embodiments, three spacing guides 290 are not equally spaced around the perimeter of dark space shield 250. When the sputtering chamber is closed, for example when the sputtering chamber is in use, spacing guides 290 maintain a minimum distance between dark space shield 250 and sputtering target 206 in the horizontal and/or vertical directions.

In some embodiments, dark space shield 250 is modified to accept spacing guides 290. For example, as shown in FIG. 4, portions of dark space shield 250b can be removed to form grooves or notches in which spacing guides 290 are positioned. In some embodiments, three spacing guides 290 are equally spaced around the perimeter of dark space shield 250b. In other embodiments, more than three spacing guides are used. When the sputtering chamber is closed, for example when the sputtering chamber is in use, spacing guides 290 can prevent dark space shield 250 from being too close to the sputtering target 206 and thus maintain a minimum distance between dark space shield 250 and sputtering target 206 in the horizontal direction.

Various modifications and additions can be made to the exemplary embodiments discussed without departing from the scope of the present invention. For example, while the embodiments described above refer to features, the scope of this invention also includes embodiments having different combinations of features and embodiments that do not include all the above-described features.

The following is claimed:

1. A spacing guide for use on a dark space shield of a sputtering chamber, the spacing guide comprising:
   a horizontal body having a first end, a second end opposite the first end and a thickness, the horizontal body configured to rest on an end of the dark space shield;
   a first leg extending laterally from the first end of the horizontal body and configured to rest against an outer surface of the dark space shield; and
   a second leg extending laterally from the second end of the horizontal body and configured to rest against the inner surface of the shield, wherein the horizontal body, the first leg and the second leg are formed from an insulating material.

2. The spacing guide of claim 1 wherein the horizontal body is about 1 millimeter to about 30 millimeters thick.

3. The spacing guide of claim 1 wherein the second leg has a thickness of not more than about 30 millimeters.

4. The spacing guide of claim 1 wherein the first leg and the second leg have a different width, length and thickness.

5. The spacing guide of claim 1 wherein the horizontal body, the first leg and the second leg are integrally formed.

6. A dark space shield assembly for use in a sputtering chamber, the dark space shield assembly comprising:
   an annular dark space shield having a first end configured to be proximate a substrate support pedestal and a second end configured to be proximate a sputtering target; and
   a plurality of spacing guides positioned on the second end of the annular dark space shield, each spacing guide comprising:
      a horizontal body having a first end, a second end opposite the first end and a thickness, the horizontal body configured to rest on the second end of the annular dark space shield;
      a first leg extending laterally from the first end of the horizontal body and configured to rest against an outer surface of the annular dark space shield; and
      a second leg extending laterally from the second end of the horizontal body and configured to rest against the inner surface of the shield, wherein the horizontal body, the first leg and the second leg are formed from an insulating material.

7. The dark space shield assembly of claim 6 wherein the plurality of spacing guides are attached to the annular dark space shield only by friction forces.

8. The dark space shield assembly of claim 6 wherein the plurality of spacing guides are attached to the annular dark space shield by fasteners.

9. The dark space shield assembly of claim 6 wherein the spacing guides maintain the misalignment of the sputtering target and the annular dark space shield within about 5 millimeters along a horizontal axis.

10. The dark space shield assembly of claim 9 wherein the spacing guides maintain the misalignment of the sputtering target and the annular dark space shield within about 1 millimeter along horizontal axis.

11. The dark space shield assembly of claim 9, wherein the horizontal body is not more than about 30 millimeters thick.

12. The dark space shield assembly of claim 9 wherein the second leg has a thickness of not more than about 30 millimeters.

13. A sputtering chamber assembly comprising:
   a sputtering target;
   an annular dark space shield having a first end configured to be proximate a substrate support pedestal and a second end configured to be proximate the sputtering target; and
   a plurality of spacing guides positioned on the second end of the annular dark space shield, each spacing guide comprising:
      a horizontal body having a first end, a second end opposite the first end and a thickness, the horizontal body configured to rest on the second end of the annular dark space shield;
      a first leg extending laterally from the first end of the horizontal body and configured to rest against an outer surface of the annular dark space shield; and
      a second leg extending laterally from the second end of the horizontal body and configured to rest against the inner surface of the shield, wherein the horizontal body, the first leg and the second leg are formed from an insulating material.

14. The sputtering chamber assembly of claim 13 wherein the plurality of spacing guides are attached to the annular dark space shield only by friction forces.

15. The sputtering chamber assembly of claim 13 wherein the plurality of spacing guides are attached to the annular dark space shield by fasteners.

16. The sputtering chamber assembly of claim 13 wherein the spacing guides maintain a misalignment of the sputtering target and the annular dark space shield within about 1 millimeter along a horizontal axis.

17. The sputtering chamber assembly of claim 16 wherein the spacing guides maintain the misalignment of the sputtering target and the annular dark space shield within 1 millimeter along a vertical axis.

18. The sputtering chamber assembly of claim 13 wherein the horizontal body is about 1 millimeter to about 30 millimeters thick.

19. The sputtering chamber assembly of claim 13 wherein the second leg has a thickness of not more than about 30 millimeters.

\* \* \* \* \*